United States Patent [19]
Prentice

[11] Patent Number: 5,767,757
[45] Date of Patent: Jun. 16, 1998

[54] ELECTRICALLY VARIABLE R/C NETWORK AND METHOD

[75] Inventor: John S. Prentice, Palm Bay, Fla.

[73] Assignee: Harris Corporation, Melbourne, Fla.

[21] Appl. No.: 687,995

[22] Filed: Jul. 29, 1996

[51] Int. Cl.$^6$ .............................. H03H 7/06; H01L 29/96
[52] U.S. Cl. ............................................ 333/172; 257/536
[58] Field of Search ................................ 333/167, 172, 333/185; 257/367, 536

[56] References Cited

U.S. PATENT DOCUMENTS

| | | | |
|---|---|---|---|
| 4,263,518 | 4/1981 | Ballatore et al. | 257/271 |
| 4,672,402 | 6/1987 | Yamaoka et al. | 257/367 |
| 5,065,132 | 11/1991 | Taddiken et al. | 257/536 |
| 5,241,211 | 8/1993 | Tashiro | 257/347 |

FOREIGN PATENT DOCUMENTS 62-92458  4/1987  Japan ............................... 257/536

Primary Examiner—Robert Pascal
Assistant Examiner—Justin P. Bettendorf
Attorney, Agent, or Firm—Rogers & Killeen

[57] ABSTRACT

An integrated circuit R/C network and method for providing a selectively variable impedance in which a capacitor has a high resistivity semiconductor plate with a low resistivity body contact region therein, the contact region for providing a variable resistance in series with the capacitor, and in which a control terminal is connected to the plate for selectively applying a control voltage thereto which varies the series resistance to thereby vary the impedance of the network.

26 Claims, 1 Drawing Sheet

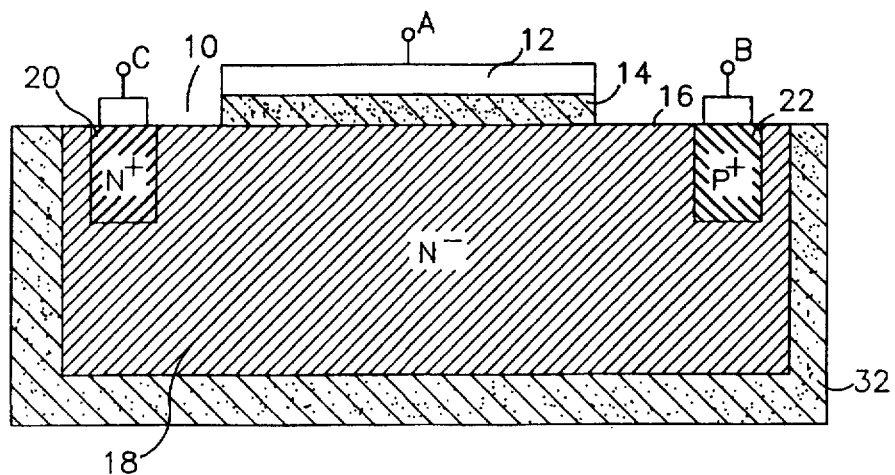
FIG. 1
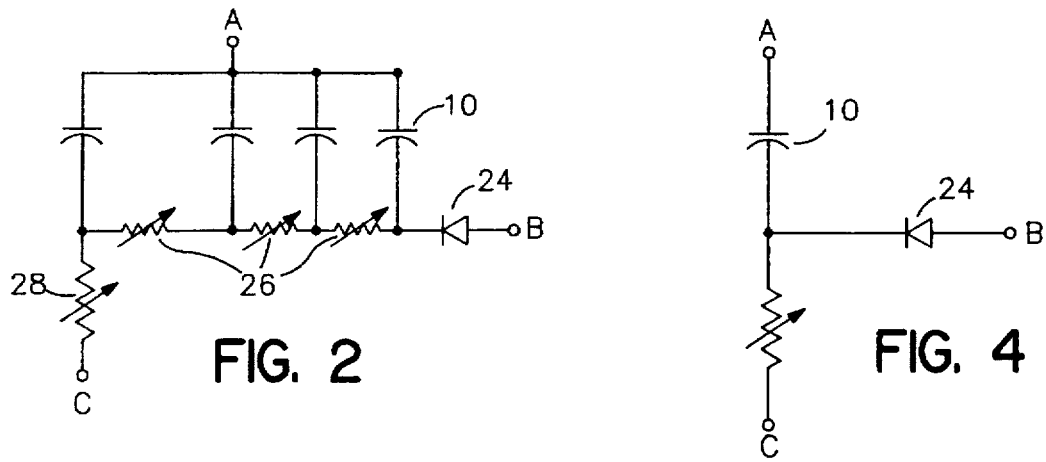
FIG. 2
FIG. 4
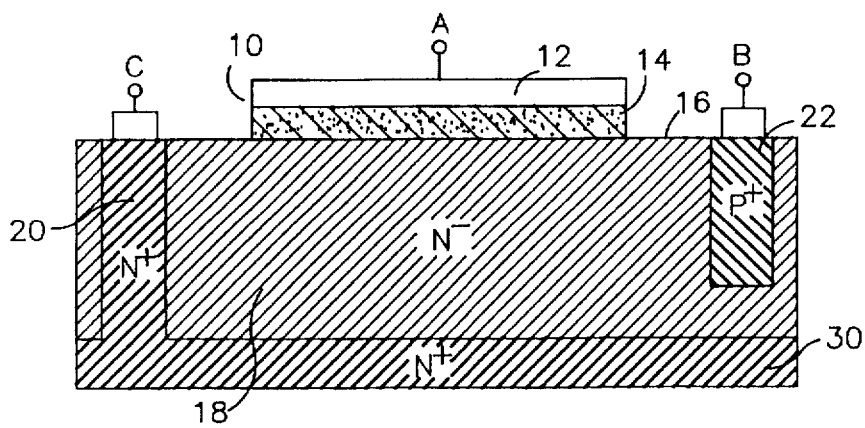
FIG. 3

ELECTRICALLY VARIABLE R/C NETWORK AND METHOD

BACKGROUND OF THE INVENTION

The present invention is directed to circuits and methods for providing an electrically variable impedance, and more particularly to a circuit and method in which the series resistance of an R/C network is varied to vary the impedance.

Various types of circuits, such as those found in some radios, may have need for an impedance which can be varied electronically. In the prior art this need is typically met with a varactor diode which has a voltage adjustable capacitor. When the varactor diode is reverse biased the junction depletion region forms a capacitor. The thickness of the junction depletion region varies with the reverse bias voltage, and thus the capacitance of the capacitor in the junction depletion region is inversely proportional to the reverse bias voltage. That is, the impedance of the circuit may be varied by varying the reverse bias voltage which varies the capacitance which in turn varies the impedance.

One of the problems with the typical varactor diode is that its use in low voltage circuits is limited by the relative magnitude of the AC signals and the DC bias. Thus, the change in capacitance (and thus the change in impedance) per change in the DC bias is small. When the DC bias is provided by a low voltage battery (which may be less than a volt) the total possible variation in impedance is also small. The present invention addresses this problem by providing a change in resistance (and thus a change in impedance) which is more sensitive to a change in DC voltage than the capacitance is to a change in reverse bias voltage so that the total possible variation in impedance is better suited for use with a low voltage battery.

A further problem of the prior art is that a varactor diode formed in an integrated circuit has a dopant diffusion profile which is usually sufficiently different than the diffusion profiles for other components in the circuit so as to require extra processing steps or a separate component, thereby driving up costs and manufacturing complexity. The present invention affords a more compatible diffusion profile.

Accordingly, it is an object of the present invention to provide a novel circuit and network which may be a replacement for the varactor diode of the prior art and which obviates the problems of the varactor diode.

It is another object of the present invention to provide a novel circuit and method which varies impedance by changing the resistance of an R/C network to thereby vary its impedance.

It is yet another object of the present invention to provide a novel circuit and method which varies impedance by changing the series resistance of an R/C network and which is sensitive to a change in a DC control voltage so that the total possible variation in impedance is suitable for use with a low voltage battery.

It is still another object of the present invention to provide a novel integrated circuit R/C network having a capacitor with a semiconductor lower plate and a body contact region therein for providing a variable resistance in series with the capacitor, and a control terminal connected to the plate for selectively applying a control voltage thereto which changes the series resistance to thereby vary the network's impedance.

It is a further object of the present invention to provide a novel R/C network and method for providing a variable impedance in which the network has a capacitor plate with a first conductivity type, high resistivity semiconductor body, a body contact region which is a low resistivity region of the body for providing a variable resistance in series with the capacitor, and a control terminal which is a low resistivity region of a second conductivity type within the body for controlling the series resistance by injecting carriers from the control terminal and inducing injection of carriers from the body contact region into the body in response to application of a control voltage to the control terminal to thereby change the series resistance of the network.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a vertical cross section of an embodiment of the present invention.

FIG. 2 is circuit diagram of the embodiment of FIG. 1.

FIG. 3 is a vertical cross section of a further embodiment of the present invention.

FIG. 4 is circuit diagram of the embodiment of FIG. 3.

DESCRIPTION OF PREFERRED EMBODIMENTS

A preferred embodiment of the circuit and method of the present invention for varying impedance includes an integrated circuit R/C network in which a capacitor and a resistive element are connected in series in the network, and in which a control voltage is applied to a plate of the capacitor which changes the series resistance of the network to thereby vary its impedance.

With reference now to FIG. 1 an embodiment of the present invention may include a MOS or SOS capacitor 10 which includes a top plate 12, a dielectric 14 which may be any suitable dielectric such as silicon dioxide or silicon nitride, and a bottom plate 16. Plate 16 of capacitor 10 may be a high resistivity semiconductor body 18 of a first semiconductor type (N type being shown by way of example, but the invention is not so limited.) The resistive element of the R/C network may include a low resistivity body contact region 20 of the first semiconductor type diffused into body 18 for providing a variable resistance in series with the resistance of capacitor 10. Contact region 20 is desirably separated from dielectric 14 so that capacitor 10 has a significant resistance in series. A control terminal 22 of the opposite semiconductor type and low resistivity may also be diffused into body 18 to form a P/N junction with body 18 for the application of a control voltage. While resistivity values vary with the nature of the use of the network, a "high resistivity" may be considered to be more than 10 ohm-cm and a "low resistivity" may be considered to less than 1 ohm-cm. Connections A, B, C may be provided as shown by way of example in FIG. 1.

In operation, the arrangement of FIG. 1 provides a series resistance which may be characterized as shown by the circuit diagram of FIG. 2. The AC signal is applied across connection A to connection C and a DC control voltage is provided to connection B. The P/N junction between control terminal 22 and body 18 forms a diode 24, body 18 forms variable resistors 26, and contact region 20 is, in effect, variable resistor 28. When diode 24 is turned on with the control voltage applied to connection B, (that is, a forward bias current flows from connection B to connection C) holes from the P+ diffusion of control terminal 22 (i.e., excess carriers) are injected into body 18 from control terminal 22 which conductivity modulates body 18 (reduces the series resistance of the network.) Further, the forward bias induces injection of electrons from the N+ diffusion of contact region 20 into body 18 thereby providing more excess carriers. The excess carriers reduce the series resistance and thereby reduce the impedance of the network.

The concentration of excess carriers is a function of the applied control voltage and can range over many orders of magnitude so that the series resistance can also be modulated over several orders of magnitude. The magnitude of the excess carriers increases exponentially with applied bias due, at least in part, to the induce injection of excess carriers from contact region 20, so that the change in resistance is very sensitive to the control voltage even when it is less than one volt.

In an alternative embodiment shown in FIGS. 3–4, a low resistivity buried layer 30 may be provided in body 18 for increased modulation. Layer 30 may be integral with contact region 20, although this is not required.

The network may include structure for confining the excess carriers in body 18, such as an oxide isolation 32 (FIG. 1) or the layer 30 and contact region 20 extended around body 18 (shown in part in FIG. 3).

In addition to enabling the use of a low control voltage which makes the invention suitable for battery operated devices, the structure includes diffusions which are compatible with conventional manufacture of semiconductor components, and reduces or eliminates nonlinearities. As to the latter advantage, if the two diffusions (20 and 22) are close, the applied voltage of signal (A) can be very large compared to the control voltage of signal (B) without any nonlinearity in the resistance. The capacitor is linear.

By way of example of use of the present invention, the R/C network of FIG. 1 may be substituted for a varactor diode in a radio. Capacitor 10 may be an 85μ by 85μ MOS capacitor with a 500 Å dielectric layer 14 over a 20μ thick body 18 with 20 ohm-cm resistivity, and a buried layer 30 with no significant resistance. Capacitor 10 would have a capacitance of 5 pF and a series resistance of 277Ω. The series resistance may be reduced by a factor of 10 when the carrier concentration is increased by a factor of 10 by forward biasing the P/N junction (diode 24) by 2.3 $V_T$ ($V_T$=kT/q). Similarly, the series resistance may be reduced by a factor of 100 by applying a forward bias of 4.6 $V_T$.

By way of further example, the present invention may be connected in parallel with a regular capacitor to form a variable capacitor which has a higher Q than the present invention alone. The minimum circuit Q is proportional to the ratio of the regular capacitor capacitance to the capacitance of the present invention, although the tuning range is inversely proportional to this ratio. The invention may also be used to control bandwidth in R/C filters or phase shift networks. Another example of use of the present invention is to adjust timing or phase shift. An R/C network may be used to generate two signals that are 90° phase shifted from each other. The present invention may be added in series or parallel to any or all of the resistors and capacitors in the network to correct mismatches and parasitics. The present invention may also be used to tune an R/C network so that two signals are each 45° (equal amplitudes) from an input signal even if the input frequency changes.

As will be appreciated, the series resistance herein may dissipate AC signal power and thus the present invention may be preferred where series resistance is desirable. Further, the excess carriers tend to recombine so that a DC current is needed where the varactor diode does not.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. An integrated circuit R/C network for providing a selectively variable impedance comprising a capacitor having a high resistivity semiconductor plate with a low resistivity body contact region therein for providing a variable resistance in series with said capacitor, and a control terminal connected to said plate for selectively applying a control voltage thereto which changes the series resistance to thereby vary the impedance.

2. The network of claim 1 wherein said plate is a lower plate of said capacitor and comprises a semiconductor body of a first conductivity type with a high resistivity.

3. The network of claim 2 wherein said capacitor further comprises an upper metal plate and a dielectric for separating said upper plate from said lower plate and said body.

4. The network of claim 3 wherein said low resistivity body contact region is of the first conductivity type and is separated from said dielectric.

5. The network of claim 4 wherein said control terminal comprises a control region of a second conductivity type in said body spaced from said dielectric and said body contact region and having a low resistivity for injecting carriers into said body and inducing injection of carriers from said body contact region into said body in response to application of a control voltage thereto.

6. A circuit for providing a variable impedance comprising:

a capacitor with a plate comprising a first conductivity type, high resistivity semiconductor body;

a body contact region comprising a low resistivity region of said body for providing a variable resistance in series with said capacitor; and a control terminal comprising a low resistivity region of a second conductivity type within said body for controlling the series resistance by injecting carriers from said control terminal and from said body contact region into said body in response to application of a control voltage to said control terminal.

7. The circuit of claim 6 further comprising means for confining the injected carriers in said body.

8. The circuit of claim 7 wherein said means for confining comprises an oxide isolation around said body.

9. The circuit of claim 7 wherein said means for confining comprises said body contact region extended around said body.

10. The circuit of claim 6 wherein the high resistivity is greater than 10 ohm-cm and the low resistivity is less than 1 ohm-cm.

11. The circuit of claim 6 wherein said body contact region comprises a buried layer in said body.

12. The circuit of claim 6 wherein a primary voltage carried by the circuit is substantially greater than the control voltage.

13. The circuit of claim 12 wherein the control voltage is less than one volt.

14. An integrated circuit R/C network for providing a variable impedance comprising:

a lower plate of a capacitor in the R/C network comprising a semiconductor body of a first conductivity type with a high resistivity;

an upper plate of the capacitor separated from said lower plate by a dielectric;

a low resistivity body contact region of the first conductivity type in said body and separated from said dielectric for providing a variable resistance in series with the capacitor in the R/C network comprising; and a control region of a second conductivity type in said body spaced from said dielectric and said body contact region and having a low resistivity, for injecting carriers into said body and inducing injection of carriers from said body contact region into said body in response to application of a control voltage to said control region, the magnitude of the control voltage controlling the injection of the carriers into said body so that the series resistance, and thereby the impedance of the R/C network, is a function of the control voltage.

15. The network of claim 14 wherein the dielectric comprises one of a silicon dioxide layer and a silicon nitride layer.

16. The network of claim 14 further comprising a low resistivity buried layer of the first conductivity type in said body.

17. The network of claim 16 wherein said body contact region and said buried layer are integral.

18. The network of claim 14 further comprising a means connected to said control region for providing the control voltage.

19. The network of claim 14 further comprising an oxide insulation layer surrounding sides and a lower surface of said body.

20. A method for varying impedance in an integrated circuit R/C network comprising the steps of connecting a capacitor and a resistive element in series in the network, and applying a control voltage to a plate of the capacitor which changes the series resistance of the network to thereby vary its impedance.

21. The method of claim 20 wherein the plate of the capacitor is a high resistivity semiconductor body which has therein a low resistivity body contact region for providing a variable series resistance, and the step of applying the control voltage comprises the step of applying the control voltage to a control terminal connected to the plate.

22. The method of claim 21 wherein the step of applying the control voltage injects carriers from the control terminal into the body and induces injection of carriers from the body contact region into the body.

23. A method for providing a variable impedance in an integrated circuit comprising the steps of:

providing a capacitor with a plate comprising a first conductivity type, high resistivity semiconductor body;

providing a low resistivity body contact region in the body for providing a variable resistance in series with the capacitor; and applying a control voltage to a low resistivity control of a second conductivity type within the body to inject carriers from the control terminal and from the body contact region into the body in response to application of a control voltage to the control terminal.

24. The method of claim 23 further comprising the step of confining the injected carriers in the body.

25. The method of claim 23 further comprising the step of providing the control voltage which is substantially less than a primary voltage carried by the circuit.

26. The method of claim 25 wherein the control voltage is less than one volt.

* * * * *